(12) United States Patent
Sachdev et al.

(10) Patent No.: US 6,277,799 B1
(45) Date of Patent: Aug. 21, 2001

(54) AQUEOUS CLEANING OF PASTE RESIDUE

(75) Inventors: Krishna G. Sachdev, Hopewell Junction; James N. Humenik, LaGrangeville; John U. Knickerbocker, Hopewell Junction; Glenn A. Pomerantz, Kerhonkson, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/344,886

(22) Filed: Jun. 25, 1999

(51) Int. Cl.[7] ................................ C11D 1/72; C11D 3/22; C11D 9/60
(52) U.S. Cl. ...................... 510/176; 510/175; 510/477; 510/434; 134/2; 134/3; 134/38; 134/42
(58) Field of Search ...................................... 510/164, 175, 510/176, 477, 434; 134/1.3, 2, 3, 38, 42; 156/668; 252/668, 156; 438/689, 692

(56) References Cited

U.S. PATENT DOCUMENTS

| | | | |
|---|---|---|---|
| 4,039,371 | * | 8/1977 | Brunner et al. ................ 156/668 |
| 4,362,486 | | 12/1982 | Davis et al. . |
| 4,483,040 | | 11/1984 | Magee et al. . |
| 5,221,362 | | 6/1993 | Porta et al. . |
| 5,264,047 | | 11/1993 | Winston et al. . |
| 5,279,756 | | 1/1994 | Savio et al. . |
| 5,286,403 | | 2/1994 | O'Dwyer et al. . |
| 5,464,553 | | 11/1995 | Winston et al. . |
| 5,466,389 | * | 11/1995 | Illardi et al. ....................... 252/156 |
| 5,498,293 | * | 3/1996 | Ilardi et al. ........................... 134/3 |
| 5,575,857 | | 11/1996 | Lunski et al. . |
| 5,593,504 | | 1/1997 | Cala et al. . |
| 5,643,818 | | 7/1997 | Sachdev et al. . |
| 5,679,169 | * | 10/1997 | Gonzales et al. ................ 134/1.3 |
| 5,705,089 | * | 1/1998 | Sugihara et al. ................. 252/79.1 |
| 5,855,811 | * | 1/1999 | Grieger et al. ................... 252/79.3 |
| 5,858,109 | * | 1/1999 | Hymes et al. ........................ 134/2 |
| 5,989,353 | * | 11/1999 | Skee et al. ............................ 134/2 |
| 6,017,862 | * | 1/2000 | Doyel et al. ...................... 510/163 |
| 6,033,993 | * | 3/2000 | Love, Jr. et al. ................... 438/745 |
| 6,060,439 | * | 5/2000 | Doyel et al. ...................... 510/164 |

FOREIGN PATENT DOCUMENTS

407305093A * 11/1995 (JP) .

* cited by examiner

*Primary Examiner*—Margaret Einsmann
*Assistant Examiner*—Gregory E Webb

(57) ABSTRACT

This invention relates to an aqueous cleaning method for removal of metal-organic composite paste residue from the surface of components, such as, screening masks, associated paste screening equipment, substrates, to name a few. The invention is particularly concerned with aqueous alkaline cleaning solutions comprising alkali metal salt and/or quaternary ammonium salt of an organic acid preferably α-hydroxy carboxylic acid in the presence of excess alkali and optionally a surface active agent for use in cleaning components, such as, screening masks, associated screening equipment, substrates, etc., which are used in the production of electronic components.

17 Claims, No Drawings

AQUEOUS CLEANING OF PASTE RESIDUE

FIELD OF THE INVENTION

This invention relates to an aqueous cleaning method for removal of metal-organic composite paste residue from the surface of components, such as, screening masks, associated paste screening equipment, substrates, to name a few. The invention is particularly concerned with aqueous alkaline cleaning solutions comprising alkali metal salt and/or quaternary ammonium salt of an organic acid preferably α-hydroxy carboxylic acid in the presence of excess alkali and optionally a surface active agent for use in cleaning components, such as, screening masks, associated screening equipment, substrates, etc., which are used in the production of electronic components.

BACKGROUND OF THE INVENTION

In the fabrication of ceramic substrates or ceramic chip carriers, conductive metal pattern for wiring and via metallurgy on substrate is defined by screening metal-polymer composite paste on green sheet by screening through a contact mask, such as a metal mask with closely spaced fine dimension etched pattern. Paste screening through such masks leaves paste residue on the mask surface as well as on the side walls of the mask features. This residue must be removed after one or more screening passes in order to assure consistent quality defect-free screened pattern.

Standard process for ceramic substrate production involves green sheet casting of ceramic slurry on a carrier, green sheet blanking, via punch, circuit personalization by screening of conductive paste through a mask screen, followed by singulation/sizing, inspect/collate/register, stack and lamination, binder burn-off and sintering operation.

The ceramic slurry typically comprises ceramic filler, polymer binder, solvent vehicle and dispersing agent.

The conductive pastes commonly used in multilayer ceramic (MLC) technology are dispersions of metal powder, polymer binder, and a high boiling solvent system along with suitable surfactants, dispersants, and thickening agents to obtain desired screening characteristics.

Commonly used metal fillers are molybdenum, copper, tungsten, and nickel in conjunction with polymer binders of the type, ethyl cellulose, acrylate polymers as poly(methyl methacrylate), poly(ethyl methacrylate) and related systems, and polyhydrocarbons based thermoplastic resins, which are all hydrophobic polymer systems.

Representative high boiling solvents used in metal-polymer dispersions are ester-alcohol such as 2,2,4-trimethylpentane diol-1,3-monoisobutyrate (Texanol), glycol ether type solvents, such as, di(ethyleneglycol) monomethyl ether, di(ethyleneglycol) monobutyl ether acetate or butyl carbitol acetate (BCA), di(propyleneglycol) monomethyl ether, di(propylene glycol) monobutyl ether and the like.

Solids component of the pastes used typically comprise between about 70 to about 85% by weight of metal filler, between about 1 to about 5% of organic binder and other necessary organic additives, and the balance constituting the solvent vehicle system. Depending on the binder-solvent system used in paste formulations, the paste can be polar or non-polar, hydrophilic or oleophilic and thus having different wetting characteristics for water-based cleaning and also to having different interface interactions and adhesion to various metal mask surfaces. Selection of a particular paste type in terms of the metal filler and its particle size distribution, the polymer binder and the solvent system is dictated by the requirement of the desired circuit pattern, conductivity of metallurgical pattern, and compatibility of the paste with the ceramic green sheet material.

In high throughput screening in the production of ceramic substrates, mask cleaning has been carried out with organic solvents in a real time operation to provide cycle time compatibility with manufacturing screening and cleaning requirements, such as described in U.S. Pat. No. 4,362,486 (Davis) and U.S. Pat. No. 4,483,040 (Magee), assigned to International Business Machines Corporation, Armonk, USA, and the disclosures of which are incorporated herein by reference.

With organic solvent-based cleaning, there are issues of flammability or combustibility, chemical safety, and waste disposal and associated cost, and therefore, aqueous cleaning is generally preferred for high volume production environment.

U.S. Pat. No. 5,221,362 (Porta) describes non-halogenated aqueous degreasing compositions based on mixture of alkanoic acid including hydroxy alkanoic acid, straight chain alkanol or an alkyl ester and water for use in removing inks and cleaning printed circuit boards.

U.S. Pat. No. 5,264,047 (Winston) describes aqueous cleaning compositions comprising alkaline salts, organic adjuvants, and a low foam hydrotrope comprised of alkali metal salt of carboxylic acids having a chain length of 7–13 carbon atoms. These compositions are used in removing soldering flux and other residue from printed wiring boards.

U.S. Pat. No. 5,279,756 (Savio) discloses non-phosphate machine dishwashing detergents, such as, alkali metal carbonate, bicarbonate, and hydroxy carboxylic acid as complexing agent.

U.S. Pat. No. 5,286,403 (O'Dwyer) describes phase-stable, aqueous cleaning concentrates containing an inorganic acid and organic acid with surfactants for cleaning floor tiles.

U.S. Pat. No. 5,464,553 (Winston) is concerned with aqueous cleaning compositions comprising alkali metal salt as carbonate/bicarbonate, organic adjuvants, and a hydrotrope for solder flux removal.

U.S. Pat. No. 5,575,857 (Lunski) is concerned with aqueous alkaline cleaning concentrate for removing inorganic salt or scale from metal surface, the cleaning solution consisting of sodium and potassium carbonate salt and a hydrotrope as sodium, potassium, ammonium, and alkanolammonium salt of sarcosinate.

U.S. Pat. No. 5,593,504 (Cala) describes method of cleaning solder paste from substrates with an aqueous cleaner, such as, alkali metal carbonate, a surfactant, alkali metal silicate, and a stabilizer for silicate, to provide a safer replacement for alcohol solvents.

As stated earlier, this invention is concerned with cleaning masks and associated equipment used in screening conductive paste onto green sheet in the manufacture of multilayer ceramic substrates. The invention is also applicable to cleaning metal stencils used in the deposition of solder paste pattern on substrates. This invention is especially concerned with aqueous cleaning of screening masks with water-based cleaning compositions that are, preferably biodegradable and/or are compatible with standard wastewater treatment methods.

According to this invention, it has been found that alkaline solutions comprising α-hydroxy acid salts, particularly, sodium, potassium, and tetraalkyl ammonium salt of lactic acid, aspartic acid, citric acid, gluconic acid, glycolic acid, tartaric acid, and related systems in the presence of excess alkali and optionally a surface active agent provide highly effective cleaning solutions for removing screening paste residue from metal masks, such as, Cu, Cu/Ni, Cu/Ni/Cu, Mo, stainless steel, to name a few. These metal masks can be electroform masks, stencils, etc.

It has been found that aqueous solution of lactic acid, aspartic acid and/or gluconic acid, sodium and/or potassium salt, or tetramethylammonium salt with pH adjusted to between 11.5–12.8 by adding excess alkali, and optionally a low foam non-ionic and/or an amphoteric surfactant or an ionic surfactant provides excellent cleaning system for screening masks to remove Mo, Cu, Cu/Ni, and tungsten based polar and non-polar pastes using pressure spray or ultrasonic agitation. In high pressure cleaning of screening masks in the MLC production using 130–180 psi spray pressure and 140–170° F. solution temperature, cycle time for mask cleaning can be less than 20 seconds, on an automated screening and cleaning tool. These compositions are also found effective in cleaning solder paste residue from the metal stencils and screens. Such pastes generally consists of solder filler, such as, Pb/Sn eutectic, Pd/Sn/Pd, Ag/Pd, Pb/In, Sn/Bi, Sn/In, in organic carrier/solvent and fluxing agent, such as, rosin-based flux, organic acids, to name a few.

PURPOSES AND SUMMARY OF THE INVENTION

The invention provides novel aqueous alkaline cleaning compositions based on α-hydroxy carboxylic acid salts in the presence of excess alkali, and method for cleaning components, such as, screening masks used in the delineation of conductive pattern onto ceramic green sheet in the production of multilayer ceramic substrates. The invention is also applicable to cleaning solder paste from metal stencils. The aqueous cleaning method according to this invention provides an alternative to organic solvent-based cleaning while maintaining the cycle time requirement for high throughput production with no impact on product reliability.

Therefore, one purpose of the present invention is to provide an alternate method for cleaning mask screens used in the production of ceramic substrates that provides effective cleaning with process reproducibility and is compatible with the cycle time requirement in manufacturing operation.

Another purpose of this invention is to provide an aqueous cleaning method for removing solder paste residue from metal stencils and screens.

Yet another purpose of the present invention is to provide an aqueous cleaning composition using salt of hydroxy carboxylic acids, particularly lactic acid, aspartic acid, citric acid, tartaric acid mandelic acid, gluconic acid, glycolic acid, and combination thereof, in excess alkali, and optionally low foam surfactants, preferably amphoteric and/or non-ionic surfactants, and ionic surfactant. The composition can also contain other additives as corrosion inhibitor and softener as alkali metal silicate, alkali metal phosphate, such as, sodium tripolyphosphate (STPP).

Still another purpose of this invention to provide aqueous alkaline cleaning compositions for efficient removal of Mo, Cu, W, and Cu/Ni-based conductive paste residue from screening masks by using alkali metal salt and/or tetramethylammonium salt of lactic acid and/or aspartic acid and/or gluconic acid, with excess alkali for pH adjustment in the range of between about 11.5 and about 12.8.

Still yet another purpose of this invention to provide a method of mask cleaning with α-hydroxy carboxylic acid salt containing aqueous alkaline cleaning compositions with pressure spray and/or ultrasonic agitation techniques.

Yet another purpose of this invention is to provide an aqueous cleaning method for screening masks where the dissolved metals and organics in the waste water are readily removed by standard treatment methods while the active ingredient in the cleaning solution are mostly biodegradable or removable by standard water treatment methods and thus the waste water can be safely discharged.

Therefore, in one aspect this invention comprises an aqueous alkaline cleaning composition for removing paste residue from a component comprising, at least one water soluble salt of hydroxy carboxylic acid, water, at least one organic and/or inorganic base, and optionally a surface active agent.

DETAILED DESCRIPTION OF THE INVENTION

The aqueous cleaning compositions according to this invention are alkaline solutions of pH in the range of between about 11.5 and about 12.8, and are comprised of α-hydroxy carboxylic acid sodium and/or potassium or quaternary ammonium salt in aqueous alkali, and optionally a low foam non-ionic, ionic, and/or amphoteric surfactant. Preferred hydroxy carboxylic acid salts are derived from lactic acid, aspartic acid, citric acid, gluconic acid, tartaric acid and combinations thereof, which is neutralized with alkali metal hydroxide or alkali metal carbonate and/or bicarbonate or sesquicarbonate, and/or a quaternary ammonium hydroxide, such as, tetramethylammonium hydroxide, tetraethylammonium hydroxide, or 2-hydroxyethyltrimethylammonium hydroxide (Choline hydroxide), and combination thereof. Sodium lactate, a hydroxy carboxylic acid salt useful for the purpose of this invention is available commercially under the trade name 'Lacoline' as 70–80% in water. Corresponding potassium and tetramethylammonium salts of lactic acid and/or aspartic acid are prepared by neutralizing aqueous solution of the organic acid with stoichiometric amount of aqueous alkali and then adding excess alkali to bring to pH preferably in the range of between about 11.5 to about 12.8, preferably between about 12.1 and about 12.5.

Preferred cleaning solutions for cleaning MLC screening paste from masks according to this invention are based on tetramethylammonium lactate (TMA-lactate) and/or TMA-gluconate or a combination of the corresponding sodium or potassium and TMA-salts of lactic acid, aspartic acid and gluconic acid, with alkali in excess of stoichiometry to obtain pH in the range of between about 12.1 and about 12.5.

Alternate hydroxy carboxylic acid salts which can also be used according to this invention include salt of citric acid as trisodium citrate, sodium tartrate, sodium hydrogentartrate, potassium tartrate, potassium hydrogentartrate, mandelic acid salts, and the corresponding tetramethylammonium salts.

Surfactants may also be added which can be non-ionic, ionic, or amphoteric and combination thereof.

Low foam amphoteric surfactants preferred according to this invention are based on alkylated carboxyalkyl tertiary amines of the type R—N(CH$_2$CH$_2$COOxy)$_2$, where R=organic radical represented by C$_n$H$_{2n+1}$, n=8–12, x=H, and y=M$^+$, M being alkali metal ion, typically, Na, K, ions, or organic ammonium ion as quaternary ammonium ion. Representative amphoteric surfactants of this class include Amphoteric-N, Amphoteric AO-400 and AO-14-2 (Tomah Products), betaine derivates as coco-imidopropyl betaine and related materials which can also be used in conjunction with non-ionic and/or ionic surfactants. Low foam non-ionic surfactants that can be used alone or in combination with amphoteric surfactant are: linear primary alcohol ethoxylates, particularly those which are biodegradable, such as with trade name designations: Neodol (Shell Corp.), Pluronic 25R2, Plurafac RA 30, Plurafac A-39 (BASF), Triton DF-12, Triton-54, Triton CF10 and DF-20 (Rohm and Hass) and Polytergent ADL ultra-LF, and SLF-18 B series of biodegradable surfactants (Olin Corp.). In addition, fluoroalkylene-(polyoxyalkylene) surfactants, such as, 'Fluorads' (3M Corp.) of low foam type such as FC-171, FC-129, FC-170C, and FC-120 can also be used. Other non-ionic surfactants found effective according to this invention include polyalkyl glycoside-based as Glucopon LF-1 and related alkyl polysaccharide ethers (Henkel/Emery).

Various ionic surfactants useful for the purpose of this invention have been found to be alkyl alcohol and ethoxylated alcohol sulfates and sulfonates, as sodium lauryl sulfate, alkylarylsulfates and sulfonates, such as, sodium dodecylbenzene sulfonate.

Representative aqueous cleaning compositions according to this invention consist of:

(a) between about 0.5 and about 5.0 (wt %) solution comprising lactic acid and/or gluconic acid, sodium salt and excess NaOH or KOH or tetramethylammonium hydroxide to adjust pH in the range of between about 11.9 and about 12.7. The solution may also contain between about 0.03 and about 0.2% AO-400 as an amphoteric surfactant; and/or 0.05 to about 0.20 weight percent of a non-ionic surfactant, preferably among the biodegradable surfactant based on ethoxylated alcohols, alkyl polyglycosides.

Alternately, non-ionic surfactants of the type octylphenoxy-polyethoxyethanol such as Triton-405, and Triton X-100, can also be used.

(b) tetramethylammonium salt of lactic acid (TMA-lactate) formed by neutralization of lactic acid solution in water with aqueous tetramethylammonium hydroxide (TMAH) and additional TMAH to adjust pH to between about 12.0 and about 12.5 and having between about 0.5 and about 3.0% (wt %) of combined active ingredients TMAH salt and excess alkali, and other additives, the balance being water;

(c) between about 0.4 and about 1.0% lactic acid and/or gluconic acid salt obtained by neutralization of the acid form with NaOH, KOH, $Na_2CO_3$, sodium sequicarbonate, and/or TMAH and additional alkali, between about 0.3 and about 1.0% (wt %) to adjust pH in the range of between about 12.2 and about 12.8, and AO-400 amphoteric surfactant in combination with between about 0.05 to about 0.15 wt %, and between about 0.02 to about 0.10 wt % ethoxylated alcohol sulfate as surfactant, such as, Standapol-LF (Henkel/Emery), and primary alcohol ethoxylate as a non-ionic surfactant.

This invention provides an environmentally friendly, low cost, non-hazardous, non-toxic, and non-flammable replacement of solvent-based cleaning utilizing active ingredients that can be obtained through synthesis or are derived from natural sources. Lactic acid occurs in sour milk as a result of lactic acid bacteria, in molasses, and in many fruits. It is obtained by the fermentation of carbohydrates with *bacillus acidi* Lacti. Sodium lactate is commercially available (trade name 'Lacoline') as between about 70 and about 80% in water. Sodium gluconate is also commercially available as solution in water. Lactate salts are used in shampoos, liquid soaps, cleansing creams and other personal care products. Lactates and aspartates are readily biodegradable.

Trisodium citrate water solution has pH about 8 and sodium tartrate, pH between about 7 and about 9.

Another advantage of this invention is that the wastewater can be safely discharged after removing dissolved metal and paste organics and inorganics from the effluent from mask cleaning process.

It has been found that with Mo and W pastes, there is varying level of dissolved metal remaining in the effluent after all the suspended solids are filtered out. The dissolved Mo and W in effluent from Mo and W pastes cleaning with alkaline TMA-lactate and/or Na-lactate and/or K-lactate solutions can be easily removed by ion exchange method or by adsorption on filter-aid/activated charcoal filter bed. A method of Mo and W removal from lactate-based effluent involves filtering the effluent from cleaning paste residue using a series of filters to minimum of about 0.2 micron cartridge filter or about 500 Å membrane filter, neutralizing the filtrate with mineral acid, and filtering through Celite filter-aid and activated charcoal bed. In this treatment, about 50% reduction in dissolved Mo could be obtained, for example, initial Mo concentration of 94 ppm in the effluent was reduced to about 52 ppm after filter-aid/activated charcoal treatment. For more complete removal of dissolved metals, ion-exchange method can be used.

EXAMPLES

The following examples are intended to further illustrate the invention and are not intended to limit the scope of the invention in any manner.

Example 1

An aqueous cleaning solution comprising between about 1.7 to about 1.8 wt % of active ingredient having pH of between about 12.1 to about 12.3, was prepared by mixing about 242 g of about 85 weight percent lactic acid solution with about 1200 ml of 10 wt % NaOH aqueous solution and about 80 ml of 25 wt % aqueous tetramethylammonium hydroxide TMAH) in deionized water to make up about 5 gallons. Metal masks carrying conductive screening paste residue on about 7 to about 8 inch square active area mask, after screening operation were cleaned by pressurized spray of heated cleaning solution at between about 140 to about 150° F., at between about 60 and about 70 psi, for between about 45 and about 60 seconds, which consumed between about 2500 and about 3500 ml of solution for each mask. The spray cleaning step was immediately followed by water spray rinse at between about 120 and about 130° F. under pressure, and dry conditions. Various types of conductive pastes on Mo and Cu/Ni and Cu/Ni/Cu electroform masks included those having Mo, Cu, W, or Cu-Ni filler in ethyl cellulose binder and 2,2,4-trimethylpentane diol-1, 3monoisobutyrate (Texanol) as solvent along with other necessary additives comprising surfactant/dispersant and rheology control additives. Ultrasonic cleaning of screening masks at about 40 kHz frequency, with this solution at between about 140 and about 150° F. also provided effective cleaning within about 30 to about 60 seconds of immersion with ultrasonic agitation followed by water rinse and dry by blowing hot air. Different types of paste residue on masks that were cleaned included pastes with Mo, W, Cu, Cu/Ni metal filler with and without ceramic filler in ethyl cellulose/Texanol binder/solvent system in conjunction with hydrogenated Castor Oil as a thickening agent and sarcosinate as a surfactant was readily removed from metal masks which included Mo, Cu/Ni and Cu/Ni/Cu electroform masks.

Highly efficient cleaning of Mo, Cu, and W paste residue from Mo and electroform screening masks was obtained with this solution at between about 150 and about 170° F. using a multi-nozzle two-sided pressurized spray cleaning on an automated screening and cleaning tool at between about 150 and about 170 psi pressure requiring less than about 20 seconds for paste residue removal which was immediately followed by pressure spray rinse with hot deionized water and hot air dry. In this automated cleaning process, about 1 gallon of solution was used up for cleaning each mask with the same volume of water in the rinse cycle. Microscopic inspection of the cleaned masks showed complete removal of residue from all areas of mask for all types of pastes which included polar type comprising ethyl cellulose/ester alcohol and ethylene-glycol alkyl ether butyrate as binder-solvent vehicle system, and the non-polar paste residue comprising thermoplastic hydrocarbon resin binder with non-polar ink oil solvent vehicle.

Example 2

An aqueous cleaning solution comprising stoichiometric TMA-lactate salt (tetramethylammonium lactate) and excess TMAH to obtain pH in the range between about 12.3 and about 12.4 was prepared by mixing 100 parts (by volume) of about 1.0 % aqueous TMAH solution with about 125 parts of 1.0% solution of about 85% lactic acid solution in water to form TMA-lactate of 1:1 stoichiometry adding excess TMAH for pH adjustment to desired pH range of between about 12.3 to about 12.4. Mask cleaning with this solution to remove screening paste residue similar to the methods described in Example 1 above using spray or ultrasonic cleaning followed by water spray rinse and dry showed effective removal of residue from various types of pastes on Mo and electroform masks.

Example 3

An aqueous cleaning solution having pH about 12.7 was prepared by combining aqueous solutions of sodium lactate, sodium carbonate, and sodium hydroxide to obtain total solids between about 0.8 and about 1.0% with a relative ratio of 7:1:2 for hydroxide/carbonate/lactate concentration, respectively. Pressure spray cleaning of masks carrying residue from various types of screening pastes with this to solution pre-heated at between about 150 and about 160° F. with standard single-nozzle pressure spray method at about 70 psi and between about 45 and about 60 seconds cleaning time provided complete removal of residue. Subsequent pressure spray rinse with hot water and hot air dry gave clean masks suitable for repeat screening operation.

Example 4

An alkaline cleaning solution of pH about 12.1 and containing about 2.0% active ingredients comprising sodium lactate, excess NaOH, and non-ionic surfactant Triton X-405 and amphoteric surfactant AO-14-2 was prepared by mixing 85% lactic acid solution, about 85 g with about 90 g of about 50% (wt %) NaOH) and about 40 g X-405 surfactant (70% active) and about 40 g of AO-14-2 (about 50 percent active) in deionized water to a total solution volume of about 5 gallons. The solution was used for cleaning paste processing parts by ultrasonic cleaning method which showed effective removal of all types of paste residue from various paste processing/application parts used in screening process, including paste nozzle, reservoir, shutter and other auxiliary equipment. Typical process involved heating the cleaning solution to between about 150 to about 165° F. in an ultrasonic bath operated at about 40 kHz frequency, immersing the parts for about 5 min without ultrasonic agitation and for about 2–10 min with ultrasonic-on, time with ultrasonic agitation, depending on paste type and extent of residue build-up, removing the parts from the cleaning solution and rinsing with hot DI water and drying by blowing air.

Example 5

To an alkaline sodium lactate solution, about 4 gallons, prepared by treating lactic acid with excess NaOH in deionized water, as described in Example 4, having about 2% solids and pH of between about 12.1 and about 12.2 was combined an alkaline sodium citrate (1 gallon) prepared by adding additional NaOH to citric acid trisodium salt, having about 2% solids and about pH 12.3. The solution was heated at between about 160 and about 170° F. and used for cleaning screening masks and other paste residue carrying screening equipment using pressurized spray cleaning or with ultrasonic agitation followed by water rinse and drying cycle. Cleaning tests with different types of pastes in terms of metal filler, polymer binder, and solvent vehicle which comprised Mo, Cu, W, and Cu/Ni based conductive pastes, some of which also contained ceramic filler, showed complete and efficient removal of paste residue. Cleaning time varied with the conditions used, for example, using a standard single nozzle spray head at between about 60 to about 70 psi and between about 150 to about 160° F. solution temperature, it required between about 40 and about 60 sec spray for paste removal followed by about 30 second water rinse with ultrasonic agitation at about 40 kHz frequency, between about 1 to about 2 min, and mask cleaning on an automated screening and cleaning tool using two sided multi-nozzle spray cleaning at between 140 to about 170 psi spray pressure required only between about 15 to about 20 sec for the cleaning step followed by between about 15 to about 20 second rinse with hot deionized water.

Example 6

An alkaline solution of potassium lactate in water and having a surfactant was prepared by neutralizing lactic acid solution with 10 wt % KOH solution and adding excess KOH, and adding about 0.1 weight percent each of the Amphoteric-AO-400 (Tomah Products) and glucopon LF-1 (Henkel/Emery), as amphoteric and non-ionic surfactants, respectively, to obtain mixed solution pH about 12.3. This solution contained about 2 wt % potassium lactate with excess KOH added for desired pH, and about 0.1 wt % each of the surfactants as the total active ingredients. Spray cleaning of screening masks at between about 60 and about 70 psi and between about 145 and about 155° F. solution temperature showed effective removal of residue within about 45 to about 60 sec which was followed by spray rinse with hot water and dry. This solution was also used for ultrasonic cleaning of paste processing parts as described in Example 4.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. An aqueous cleaning composition for removing paste residue from a component comprising: at least one water soluble salt of a hydroxy carboxylic acid, water, a surface active agent and a member selected from the group consisting of organic and inorganic base, wherein said surface active agent is selected from the group consisting of biodegradable surfactant based on primary alcohol ethoxylate, alkylpolyglycosides based on polysaccharide chemistry, polyoxypropylene-polyoxyethylene block co-polymers, and combination thereof, biodegradable ethoxylated alcohol sulfates, ethoxylated alkylphenol sulfates and sulfonates, and mixtures thereof, alkylarylpolyether of the type octylphenoxy-polyethoxyethanol, nonylphenylether polyethoxylates, amphoteric surfactants of the type alkylated carboxyalkyl, tertiary amines represented by the formula R—N(CH$_2$CH$_2$COOxy)$_2$, where x=H, and y=a member selected from the group consisting of Na, K, (CH3)$_4$N$^+$ (tetramethylammonium radical), and betaine derivatives.

2. The aqueous cleaning composition of claim 1, wherein said salt of hydroxy carboxylic acid is a salt of an a-hydroxy carboxylic acid.

3. The aqueous cleaning composition of claim 2, wherein said a-hydroxy carboxylic acid is a member selected from the group consisting of lactic acid, aspartic acid, citric acid, tartaric acid, mandelic acid, gluconic acid, glycolic acid and combination thereof.

4. The aqueous cleaning composition of claim 2, wherein said salt is a member selected from the group consisting of, sodium lactate, potassium lactate, sodium aspartame, potassium aspartame, sodium citrate, potassium citrate, sodium tartrate, potassium tartrate, sodium gluconate, potassium gluconate, and combinations thereof.

5. The aqueous cleaning composition of claim 2, wherein said salt is selected from the group consisting of, tetramethylammonium lactate (TMA-lactate), TMA-aspartate, TMA-citrate, TMA-tartrate, TMA-gluconate and combinations thereof.

6. The aqueous cleaning composition of claim 2, wherein said salt is derived from the neutralization reaction of said hydroxycarboxylic acid with tetraethylammonium hydroxide, 2-hydroxyethyl-trimethylammonium hydroxide, and mixtures thereof.

7. The aqueous cleaning composition of claim 1, wherein the composition comprises an organic base and the organic base is selected from the group consisting of aqueous quaternary ammonium hydroxides, the composition have a pH of at least about 12.1 and at most about 12.5.

8. The aqueous cleaning composition of claim 7, wherein said quaternary ammonium hydroxide is selected from the group consisting of tetramethylammonium hydroxide (TMAH), tetraethylammonium hydroxide, 2-hydroxyethyl-trimethylammonium hydroxide, and mixtures thereof.

9. The aqueous cleaning composition of claim 1, wherein the composition comprises an inorganic base and the inorganic base is selected from the group consisting of alkali metal carbonate, bicarbonate, hydroxide, sesquicarbonate and combinations thereof.

10. The aqueous cleaning composition of claim 9, wherein said alkali metal is selected from a group consisting of Na, K, and combination thereof.

11. The aqueous cleaning composition of claim 1, further comprising a surface active agent selected from the group consisting of non-ionic surfactants, ionic surfactants, amphoteric surfactants and combinations thereof.

12. The aqueous cleaning composition of claim 1, wherein total concentration of active ingredients in said cleaning solution consists of hyroxycarboxylate salt, and excess base is in the range between about 0.5 to about 5 percent.

13. The aqueous cleaning composition of claim 12, wherein the total concentration of active ingredients is in the range between about 0.8 and 2.5 percent in water (wt/vol).

14. The aqueous cleaning composition of claim 1, wherein the base is inorganic and the pH of the solution is in the range of between about 11.5 and about 12.8.

15. The aqueous cleaning composition of claim 14, wherein the pH of the solution is in the range of between about 12.0 and about 12.4.

16. The aqueous cleaning composition of claim 1, wherein the at least one surfactant is present between about 0.01 and about 0.5 wt %.

17. The aqueous cleaning composition of claim 16, wherein at least one surfactant is present between about 0.02 and about 0.3 wt %.

* * * * *